United States Patent [19]

Albin et al.

[11] Patent Number: 4,749,949

[45] Date of Patent: Jun. 7, 1988

[54] SELF BIASING DIODE MICROWAVE FREQUENCY MULTIPLIER

[75] Inventors: Robert D. Albin; Frank K. David, both of Santa Rosa, Calif.

[73] Assignee: Hewlett-Packard Company, Palo Alto, Calif.

[21] Appl. No.: 857,010

[22] Filed: Apr. 29, 1986

[51] Int. Cl.$^4$ .................. H03B 19/00; H03L 7/00
[52] U.S. Cl. .................. 328/16; 307/219.1; 307/529; 307/271; 333/218
[58] Field of Search ............ 307/529, 219.1, 271, 307/317 R, 551, 565; 328/15, 16, 20, 25, 31, 32; 333/218; 363/157, 158, 159; 331/52, 76

[56] References Cited

U.S. PATENT DOCUMENTS

| | | | |
|---|---|---|---|
| 2,927,223 | 3/1960 | Meirowitz | 307/551 |
| 2,946,963 | 7/1960 | Lee | 363/157 |
| 2,963,660 | 12/1960 | Towner | 363/157 |
| 3,023,355 | 2/1962 | Thorsén | 307/551 |
| 3,076,133 | 1/1963 | Holcomb | 307/529 |
| 3,261,991 | 7/1966 | Lash | 328/20 |
| 3,271,656 | 9/1966 | Hines et al. | 307/529 |
| 3,287,621 | 11/1966 | Weaver | 307/219.1 |
| 4,400,630 | 8/1983 | Owen | 328/20 |

OTHER PUBLICATIONS

Hu, "Mm-Wave Freq. Mult. Employ Semiconductor Diodes in Balanced Configuration", MSN & CT, 1986, pp. 109–112.

Dahele et al., "Slimguide Freq. Mult. for Microwave Applications", Electrical Communications, vol. 49, No. 1, 1974, pp. 65–71.

A Dethlefsen, et al., "Millimeter-Wave Multipliers Rely on Diode Integrated Circuits in Finline Structures for High Output Power", RF & Microwave Measurement Symposium and Exhibition, Hewlett Packard, Publication No. 5954–1529, Apr., 1985 (sic.).

Primary Examiner—Stanley D. Miller
Assistant Examiner—Timothy P. Callahan
Attorney, Agent, or Firm—William C. Milks, III

[57] ABSTRACT

A microwave frequency multiplier employs a first diode and a second diode each coupled in anti-parallel relationship across a signal input of a finline structure, each of the diodes being associated with signal-induced biasing elements for self biasing the diodes. A bias is caused to occur at internal nodes which increase with increased input power for a broad range of input power levels. The presence of such biasing results in waveform clipping at higher signal levels. Relative to prior art, the conversion loss will remain optimum up to high input power over an entire high-power input range. Additional external bias may be employed in alternative embodiments.

8 Claims, 3 Drawing Sheets

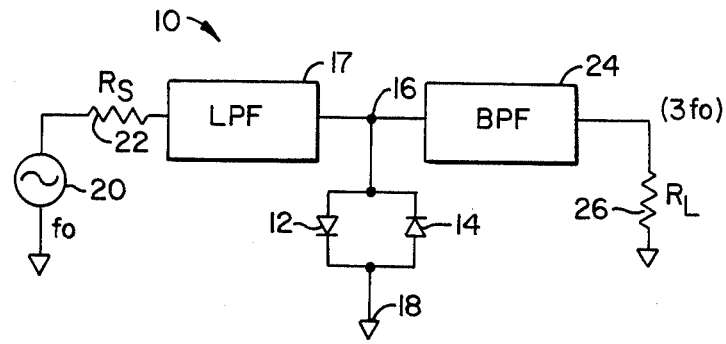
FIG._1. (PRIOR ART)
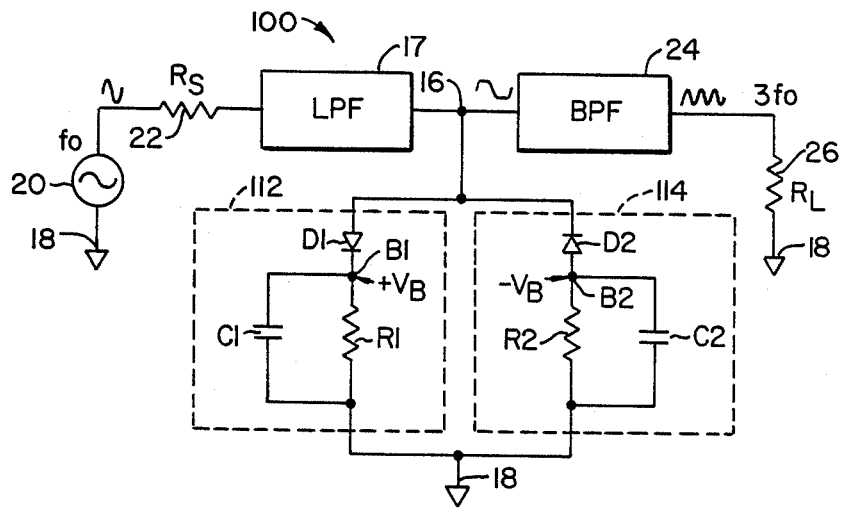
FIG._2.
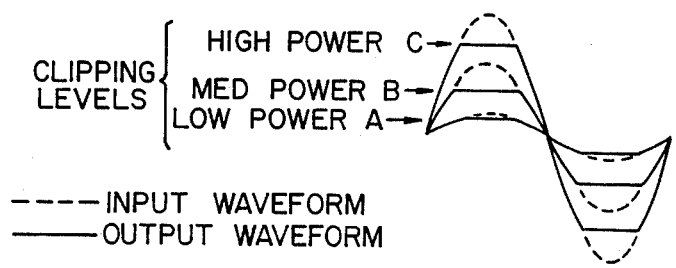
FIG._3.

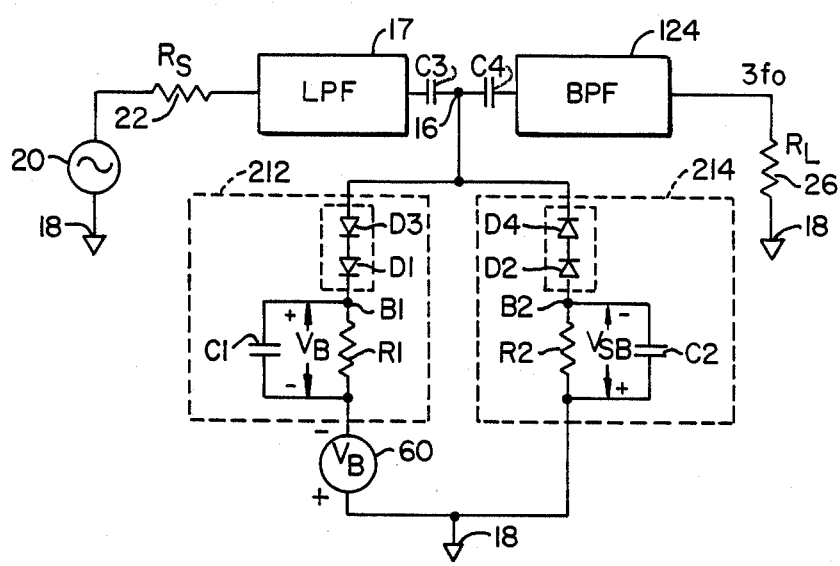
FIG._4.
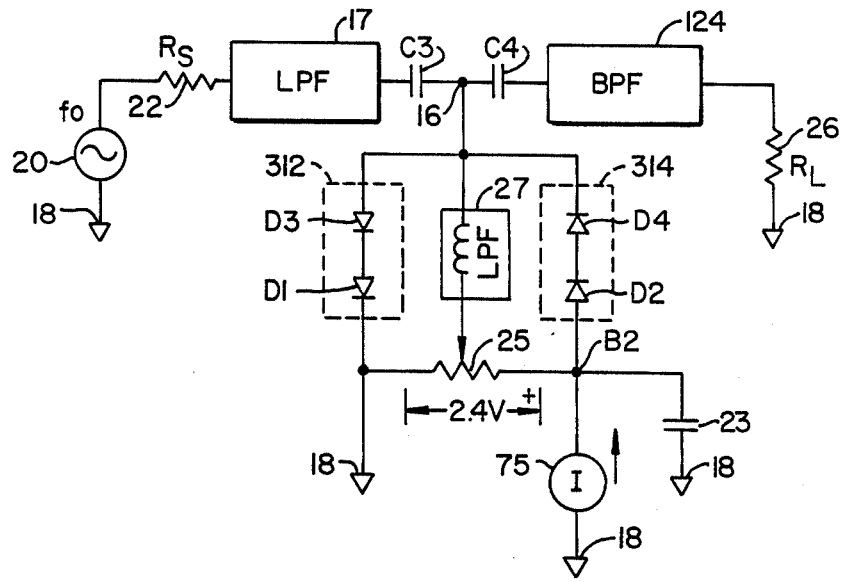
FIG._6.

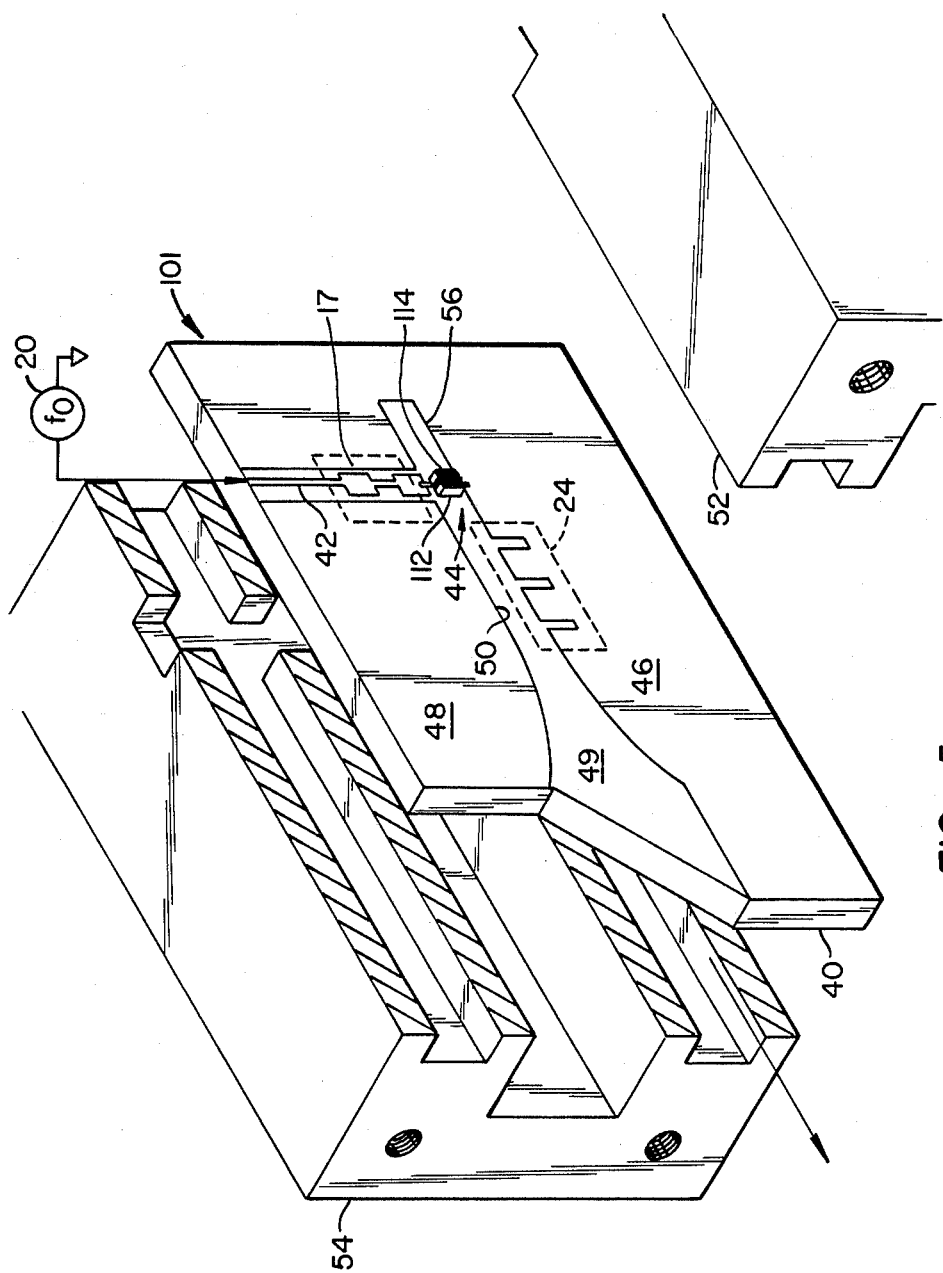
FIG._5.

SELF BIASING DIODE MICROWAVE FREQUENCY MULTIPLIER

BACKGROUND OF THE INVENTION

This invention relates to a microwave signal generator, and more particularly to a millimeter wave multiplier for generating odd harmonic signal output such as a tripler. The invention finds particular application in finline structures employing hybrid integrated circuits.

Several techniques are available for generating millimeter wave frequency signals. One of the techniques is the use of a frequency multiplier for creating harmonics from the lower frequency by use of a non-linear device. In the case of frequency multiplication, much of the initial signal preparation is carried out at lower frequencies to reduce power losses and to simplify necessary circuitry at the desired output frequency.

One of the possible techniques for generating a desired output frequency is through the use of a tripler technique wherein a limiter is used to symmetrically clip the input signal in order to generate odd order harmonic products. If the clipped input signal is precisely symmetric, there will be no even order harmonic products.

Referring to FIG. 1, there is shown a schematic diagram of a representative prior art multiplier 10 typically employed as a tripler. The multiplier 10 includes first and second diodes 12 and 14 disposed in anti-parallel relationship between a signal node 16 and (ground) reference node 18 and which are together operative to clip a signal applied at the diode barrier voltage. A lowpass filter 17 fed by a radio frequency signal source 20 through a source resistance 22 presents a source signal to the signal node 16. The clipped output at the signal node 16 is applied to a bandpass filter 24, the output of which is applied to a load 26.

In operation, the diodes 12 and 14 conduct when the oscillatory input voltage at node 16 exceeds the barrier height of the diode 12 or 14 which is forward biased relative to the (ground) reference node 18, thereby clipping the input waveform. At small input levels, however, only a small third order harmonic component is generated. As a consequence, the conversion loss, i.e., the ratio of output to input, will be very high at small input levels. On the other hand, at extremely high input levels, the output level of the output signal does not vary significantly with input signal levels. Consequently, the conversion loss is said to increase. Optimum conversion loss, that is, the range of minimum loss, is limited to a range between extremes of low power and high power.

A further disadvantage of a prior art tripler has been diode reliability under high drive levels. Large signal voltages can cause excessive current which can damage diodes in such a circuit. A conventional prior art tripler provides no protection from excessive current.

What is needed, therefore, is a multiplier circuit which is capable of relatively high conversion efficiency, that is, low conversion loss over a broad range of input levels, and which has a mechanism to protect against large excursions of potentially damaging voltage.

SUMMARY OF THE INVENTION

According to the invention, a microwave frequency multiplier employs a first self-biasing unidirectional conductive means such as nonlinear elements including diode means and a second self-biasing unidirectional conductive means such as nonlinear elements including diode means coupled in antiparallel relationship across a signal input, each of the self-biasing conductive means including a nonlinear device and biasing elements. The first self-biasing unidirectional conductive means and second self-biasing unidirectional conductive means cause a bias to occur at internal nodes which increase with increased input power for a broad range of input power levels. The presence of internal biasing results in waveform clipping at higher signal levels. Relative to prior art, the conversion loss will remain optimum up to high input power over an entire high-power input range. Self-biasing diode means in one embodiment comprise a diode coupled in series with a parallel combination of a resistive element and a capacitive element, the resistive element for developing a voltage drop across the capacitive element suitable to bias the diode, and the capacitive element being of sufficient capacitance to maintain a voltage bias level across the resistive element. The time constant determined by the values of the resistive and capacitive elements should be at least of the same order of magnitude as the period of the input signal and specifically should be longer to provide the needed voltage retention for self biasing. The value is not particularly critical. It is nevertheless important that the time constant be short enough to bleed off some charge during the "off" portion of the cycle of each diode means. Additional external bias may be employed in alternative embodiments. In addition, further diodes may be added to the diode means to provide further breakdown protection.

The invention and the advantages of the invention will be better understood by reference to the following detailed description taken in connection with the accompanying drawings.

BRIEF DESCRIPTION OF THE DRAWINGS

FIG. 1 is a schematic diagram of a prior art multiplier circuit.

FIG. 2 is a schematic diagram of a multiplier circuit according to the invention.

FIG. 3 is a waveform diagram illustrating three different clipping levels.

FIG. 4 is a schematic diagram of a multiplier circuit in accordance with the invention illustrating alternative biasing means.

FIG. 5 is an exploded perspective view of a finline structure corresponding to the embodiment of the invention represented by FIG. 2.

FIG. 6 is a schematic diagram of a still further embodiment of the invention.

DESCRIPTION OF SPECIFIC EMBODIMENTS

According to the invention, a frequency multiplier means 100 comprises a nonlinear circuit element combination including a first self-biasing unidirectional conductive means, hereinafter referred to as diode means 112, and second self-biasing unidirectional conductive means, hereinafter referred to as diode means 114, coupled in anti-parallel relationship. In a representative multiplier circuit as shown in FIG. 2, the first self-biasing diode means 112 and second self-biasing diode means 114 are coupled between a signal node 16 and a ground or like reference node 18. In the generalized circuit there is an r.f. signal source 20 which generates a signal of a frequency $f_0$ and has associated therewith a source resistance $R_s$ 22. A lowpass filter 17 coupled between the source resistance 22 and the node 16 provides input filtering to the signal node 16. A bandpass filter 24 is provided between the signal node 16 and the output as represented by a load resistance 26, the bandpass filter 24 passing primarily the selected appropriate harmonic of the fundamental frequency. For a tripler circuit, for example, the bandpass filter 24 would pass a band including only the third harmonic of the fundamental frequency.

The first self-biasing diode means 112 comprises a first diode D1 coupled in series with a first resistor R1 and with a first capacitor C1 coupled across the first resistor R1. A first bias node B1 is common to the cathode terminal of the first diode D1, the first resistor R1 and first capacitor C1. The signal node 16 is coupled to the anode terminal of the first diode D1, and the ground reference node 18 is coupled to the opposing terminals of the first capacitor C1 and first resistor R1. It is understood that the reference node 18 need not necessarily be coupled to the system ground, although such a configuration is typical.

The second self-biasing diode means 114 comprises a second diode D2 coupled in series with a second resistor R2 and with a second capacitor C2 coupled across the second resistor R2. A second bias node B2 is common to the anode terminal of the second diode D2, the second resistor R2 and second capacitor C2. The signal node 16 is coupled to the cathode terminal of the second diode D2, and the ground reference node 18 is coupled to the opposing terminals of the second capacitor C2 and first resistor R2.

The first capacitor C1 has a value chosen to be equal to the value of the second capacitor C2, and the first resistor R1 has a value chosen to be equal to the value of the second resistor R2. The first diode D1 and the second diode D2 are chosen to be matched diodes.

For a standard type WR-19 waveguide circuit, which is operative in the 40 GHz to 60 GHz frequency range, the value of first capacitor C1 (equal to the value of second capacitor C2) is chosen to be one picofarad.

The value of the first resistor R1 (equal to the value of the second resistor R2) is chosen to be 500 ohms.

The circuit of FIG. 2 operates as follows: Under sinusoidal excitation by an r.f. signal source 20, first node B1 will charge to a positive self-biased voltage level $+V_B$, and the second bias node B2 will charge to a negative bias level $-V_B$ of equal magnitude relative to the reference level at reference node 18.

Referring to FIG. 3, the output wave shapes of the self biased tripler under low power A, medium power B, and high power C are shown. The level of clipping is directly proportional to the bias at nodes B1 and B2 in the circuit of FIG. 2. With increased input power, the voltage present at the internal nodes B1 and B2 increases due to the change in bias level. The diodes, therefore, can continue to operate at the frequencies of interest in their most non-linear region over an amplitude range of input power. The capacitors C1 and C2 and resistors R1 and R2 have a time constant sufficient to provide that the voltage at the internal nodes B1 and B2 is maintained during the "off" or nonconductive state of the diodes D1 and D2. A perfectly matched pair of anti-parallel coupled diodes D1 and D2 and matched resistors R1 and R2 and matched capacitors C1 and C2 (accordingly providing an equal time constant as between the first self-biasing diode means 112 and second self-biasing diode means 114) will cause symmetrical distortion of the input waveform through the bandpass filter 24, and therefore, only odd harmonics will be created. This is precisely the desired effect in an intended frequency tripler. Furthermore, according to the invention, due to the retained voltage present at the biasing nodes B1 and B2, the diodes D1 and D2 conduct current over a smaller portion of the fundamental period as compared to the multiplier of the type shown in FIG. 1. The net effect is an improvement in device reliability because of a reduction in the effective d.c. current circulating in the diode loop beteen node 16 and node 18. Furthermore, the circuit as shown in FIG. 2 is totally self-biasing and consequently relies on no external bias.

The basic circuit embodiment as shown in FIG. 2 may be modified without departing from the scope and spirit of the invention. Referring now to FIG. 4, there is shown an alternative embodiment of the circuit in which external bias is added. In particular, a first self-biasing diode means 212 is modified by the addition of a third diode D3 coupled in series with first diode D1. Further, a second self-biasing diode means 214 comprises a fourth diode D4 coupled in series with the second diode D2. A lowpass filter 17 is d.c.-isolated from signal node 16 by a capacitor C3, and a bandpass filter 124 is d.c.-isolated from node 16 by a capacitor C4. In this embodiment, the signal node 16 is not at a virtual ground, and therefore DC isolation is needed in order to provide the same function as previously described in connection with the embodiment of FIG. 2 and to ensure proper r.f. operation. For the same reason, the embodiment of FIG. 6, below, is also provided with d.c. isolation at the signal node 16.

Further, according to the invention, external biasing may be provided in the form of a voltage bias $V_B$ between the first self-biasing diode means 212 and the reference node (ground) 18. The purpose of the bias is to bring the operating point of the diode means D1, D3 and D2, D4 at low power levels into their nonlinear operating region. Thereby the conversion loss of the multiplier will be improved for low signal levels. With increasing input power levels, the self-biasing effect continues to maintain high conversion efficiency into the high input power range. The bias means is preferably selected to develop a bias voltage in the range of twice the forward voltage drop across all of the diodes in the loop between the signal node 16 and the reference node 18. In the circuit shown in FIG. 4, the value for external bias 60 may be selected to be in the range of 2.6 volts to 2.8 volts.

The circuits of FIG. 2, of FIG. 4 and of other embodiments herein described are readily adapted to various forms suitable for microwave applications. Referring to FIG. 5, there is shown an exploded perspective view of one embodiment of the invention as it might be constructed in finline technology for use in a type WR-19 waveguide. For convenience, the embodiment of FIG. 2 is illustrated. More specifically, a finline circuit 101 comprises a substrate 40 which has mounted thereon a coplanar waveguide-type lowpass filter 17 and a substrate-mounted conductor 42 leading from an external r.f. signal source 20 to a finline channel 49, the lowpass filter 17 being coupled, according to the invention, to a first self-biasing diode means 112 and a second self-biasing means 114, as previously described, which bridge a finline gap 44 between the conductor 42 and a metallization layer 46. The finline channel 49 is formed between the first metallization layer 46 and the second metallization layer 48. A bandpass filter is realized by a lowpass filter section 24 (FIG. 5) in conjunction which the natural lower or cutoff frequency of the waveguide in which the finline circuit 101 is mounted and may be provided, if desired, between the self-biasing diode means 112 and 114 and the output of the finline circuit 101 into the waveguide cavity 50. The finline circuit 101 is housed in a waveguide, for example a type WR-19 waveguide formed of first and second mating channel segments 52 and 54. For matching purposes, a back short 56 is provided in the finline circuit 101 adjacent the finline gap 44.

The circuitry according to the invention may be further refined for practical applications. Referring to FIG. 6, there is shown a still further embodiment of the invention with means for providing more precise voltage balancing to suppress even harmonics. In the embodiment of FIG. 6, a current source 75 may be coupled into the self-biasing network, and more particularly at the node referred to herein as node B2, to supply a fixed amount of current, and balancing means 25 may be provided for balancing voltage.

Specifically, in FIG. 6, a first series-connected diode pair 312 is coupled between the signal node 16 and the reference node 18, and a second series-connected diode pair 314 is coupled in anti-parallel relationship with the first diode pair 312 between the first signal node 16 and node B2. The node B2 is biased because it has coupled thereto a holding capacitor 23, a current source 75 and balancing means 25 forming a part of a voltage divider. The holding capacitor 23 is coupled to the reference node 18, and a tap or voltage divider arm of the balancing means 25 is d.c.-coupled via a lowpass filter 27 to signal node 16 (and thus the common node of the diode pairs 312, 314). The remaining terminal of the balancing means 25 is coupled to the reference node 18. The cathode terminal of the first diode pair 312 is also coupled to the reference node 18.

The lowpass filter 27 permits a constant d.c. bias to be applied at the signal node 16 without passing r.f. to ground, thereby inhibiting operation. In d.c. operation, the current source 75 supplies sufficient current to the balancing means to establish a voltage drop equal to approximately 2.4 volts between the reference node 18 (ground) and node B2 across the balancing means 25. Thus, the voltage at node 16 can be selectively biased by adjusting the tap at any level between 0 volts and 2.4 volts at d.c. or under d.c. conditions. However, under r.f. operation conditions, a negative voltage at node B2 is developed across capacitor 23 for the same reason a negative voltage develops at the node B2 of the circuit of FIG. 2. The voltage divider arm of the balancing means 25 provides for a d.c. offset of the voltage at node 16. For example, the balancing means 25 is preferably adjusted so that the voltage at node 16 is one-half of the voltage at node B2. Notwithstanding that only a single capacitor 23 is employed, there is a self-biasing effect on the diodes D1 and D3 between node 16 and node 18. The current source 75 controls the quiescent point of the signal node 16, and the capacitor 23 provides the holding function for the self-biasing effect under r.f. excitation.

To further assure proper operation according to the invention, the signal node 16 is preferably not in d.c. connection with the input source or the output source. The circuit of FIG. 6 permits self-biasing of the tripler circuit with an additional capability of external bias, as described above. The disclosed embodiments have numerous advantages, including more efficient generation of odd harmonics suitable for multiplier applications and higher conversion efficiency, that is, reduced conversion loss over a broader range of input power.

The invention has been explained with reference to specific embodiments. Further embodiments will be apparent to those of ordinary skill in the art. It is, therefore, not intended that this invention be limited except as indicated by the appended claims.

We claim:

1. A frequency multiplier including a signal input and a signal output, said frequency multiplier comprising:
   a first diode;
   a second diode coupled in anti-parallel relationship to said first diode across said signal input to ground;
   biasing means responsive to input power for causing at least a portion of a bias voltage across said signal input to said frequency multiplier to develop, wherein said biasing means comprises a pair of parallel combinations of a resistive element and a capacitive element respectively coupled in series with each of said diodes, each said resistive element for developing a voltage drop across said capacitive element suitable to bias said diode, and each said capacitive element being of sufficient capacitance to maintain a voltage bias level across said resistive element in the presence of an input signal; and
   a voltage source coupled between a reference node and a selected one of said first or second diodes for applying a preselected external bias.

2. The frequency multiplier according to claim 1 wherein at least one of said first and second diodes has a characteristic time constant which is at least of the same order of magnitude as the period of an expected input signal.

3. The frequency multiplier according to claim 1 wherein said voltage source is coupled between said reference node and a terminal of said first diode.

4. The frequency multiplier according to claim 1 wherein said first diode and said second diode are matched diodes.

5. The frequency multiplier according to claim 1 further comprising an output filter coupled at said signal output for passing primarily only a third harmonic frequency of a fundamental input frequency.

6. A frequency multiplier including a signal input and a signal output, said frequency multiplier comprising:
   a first diode;
   a second diode coupled in anti-parallel relationship to said first diode across said signal input to ground;
   a third diode coupled in series with said first diode;
   a fourth diode coupled in series with said second diode;
   biasing means responsive to input power for causing at least a portion of a bias voltage across said signal input to said frequency multiplier to develop; and
   means coupled between a reference node and a selected one of said first or second diodes for applying a preselected external bias, wherein said external bias applying means includes a current source, and wherein a resistance is coupled between a cathode terminal of said first diode and an anode terminal of said second diode, said current source to apply current through said resistance to develop said external bias.

7. The frequency multiplier according to claim 6 further comprising a d.c. tap to a common node of an anode terminal of said third diode and of a cathode terminal of said fourth diode from said resistance, said d.c. tap being coupled through a lowpass filter for blocking r.f. signals.

8. The frequency multiplier according to claim 6 further comprising an output filter coupled at said signal output for passing primarily only a third harmonic frequency of a fundamental input frequency.

* * * * *